United States Patent
Kondo

(10) Patent No.: US 8,055,957 B2
(45) Date of Patent: Nov. 8, 2011

(54) SEMICONDUCTOR INTEGRATED CIRCUIT DEVICE HAVING FAIL-SAFE MODE AND MEMORY CONTROL METHOD

(75) Inventor: Takao Kondo, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 563 days.

(21) Appl. No.: 12/149,915

(22) Filed: May 9, 2008

(65) Prior Publication Data

US 2008/0294938 A1    Nov. 27, 2008

(30) Foreign Application Priority Data

May 22, 2007 (JP) ................. 2007-135791

(51) Int. Cl.
*G11C 29/00* (2006.01)
*G11C 11/34* (2006.01)
*H03M 13/00* (2006.01)

(52) U.S. Cl. .......... 714/710; 714/48; 714/718; 714/719; 714/754; 714/764; 365/185.09; 365/185.29; 365/185.33; 365/200; 365/201

(58) Field of Classification Search .............. 714/48, 714/718, 719, 710, 754, 764; 365/185.09, 365/185.29, 185.33, 200, 201
See application file for complete search history.

(56) References Cited

U.S. PATENT DOCUMENTS

| | | | | |
|---|---|---|---|---|
| 5,732,092 A * | 3/1998 | Shinohara | ...................... | 714/764 |
| 5,978,952 A * | 11/1999 | Hayek et al. | .................. | 714/764 |
| 6,185,134 B1 * | 2/2001 | Tanaka | ...................... | 365/185.33 |
| 6,407,944 B1 * | 6/2002 | Choi et al. | ............... | 365/185.09 |
| 6,483,747 B2 * | 11/2002 | Choi et al. | ............... | 365/185.09 |
| 6,587,384 B2 * | 7/2003 | Perner | ...................... | 365/189.05 |
| 7,009,889 B2 * | 3/2006 | Tran et al. | ................. | 365/185.29 |
| 7,012,835 B2 * | 3/2006 | Gonzalez et al. | ......... | 365/185.11 |
| 7,116,592 B2 * | 10/2006 | Takeda et al. | ................. | 365/200 |
| 7,158,416 B2 * | 1/2007 | Kern | ........................ | 365/185.22 |
| 7,224,607 B2 * | 5/2007 | Gonzalez et al. | ......... | 365/185.11 |
| 7,305,596 B2 * | 12/2007 | Noda et al. | ..................... | 714/718 |
| RE40,252 E * | 4/2008 | Tanaka | ...................... | 365/185.33 |
| 7,392,457 B2 * | 6/2008 | Tamura et al. | ................. | 714/763 |
| 7,463,532 B2 * | 12/2008 | Tran et al. | ................. | 365/185.29 |
| 7,512,014 B2 * | 3/2009 | Tran et al. | ................. | 365/185.29 |
| 7,518,919 B2 * | 4/2009 | Gonzalez et al. | ......... | 365/185.11 |
| 7,573,773 B2 * | 8/2009 | Lin | .............................. | 365/222 |
| 7,676,728 B2 * | 3/2010 | Resnick et al. | ............... | 714/764 |
| 2007/0101238 A1 * | 5/2007 | Resnick et al. | ............... | 714/763 |

(Continued)

FOREIGN PATENT DOCUMENTS

JP    2006-48893    2/2006

*Primary Examiner* — John J Tabone, Jr.
(74) *Attorney, Agent, or Firm* — McGinn IP Law Group, PLLC

(57) ABSTRACT

An integrated circuit device contains a flash memory, a flash control unit for controlling the rewriting and reading on the flash memory, and a processor unit. The processor unit includes a normal mode and a fail-safe mode as the operating states. In normal mode, when a defect is detected during the verify operation after writing data onto the flash memory then any further use of the flash memory is stopped. In fail-safe-mode, when a defect is detected during the verify operation after writing data onto the flash memory, the error is corrected and flash memory usage continues. The operating state is normal mode, and when the verify operation detects a defect after normal mode erase operation, the operation shifts to fail-safe mode.

14 Claims, 16 Drawing Sheets

U.S. PATENT DOCUMENTS

2009/0177932 A1* 7/2009 Abts et al. .................. 714/704
2009/0187785 A1* 7/2009 Gonzalez et al. ............ 714/5
2010/0023800 A1* 1/2010 Harari et al. ................ 714/2
2010/0185897 A1* 7/2010 Abts et al. .................. 714/16

* cited by examiner

SEMICONDUCTOR INTEGRATED CIRCUIT DEVICE HAVING FAIL-SAFE MODE AND MEMORY CONTROL METHOD

BACKGROUND OF THE INVENTION

1. Field of the Invention

This invention relates to a semiconductor integrated circuit device for storing a flash memory and also relates to a memory control method for regulating access to that flash memory.

2. Description of Related Art

Demand has been increasing in recent years for EEPROM emulations to add a small data capacity to the flash memory as a substitute for an external EEPROM. These EEPROM applications require an extremely large number of rewrite operations and so must provide reliability for this (large) number of rewrites.

In the technology disclosed in Japanese Patent Laid Open Application No. 2006-48893, the hardware selects a spare block address as the physical address from the defect block mapping information and the control address that was received. The flash memory includes a memory cell array unit, a defect block mapping register unit, an address selector unit, and a defect block status control unit. The memory cell array unit stores the data by way of the received physical address, and stores the defect block mapping information. The defect block mapping register unit stores the defect block mapping information. The address selector unit generates a defect block address by selecting a spare block address matching the logical address or an externally applied logical address, as the physical address. The defect block control status unit receives the defect block address from the address selector unit, and updates the defect block mapping information in the defect block mapping register. The defect block status control unit counts the number of defect block addresses stored in the defect block mapping register unit, and controls the selection operation performed by the address selector unit. The defect block status control unit then stores the defect block mapping information stored in the defect block mapping register unit, into the memory cell array unit.

In other words, the defect block information read out (loaded) from the mapping information storage block in the flash memory is stored in the defect block mapping register unit. The address selector unit compares the logical address that was received externally, with the defect block mapping table. If this comparison results in access to a defect block, then a spare block address is output to the memory cell array.

The flash memory cell contains multiple memory cells each connected to one word line and bit line. In the case of a flash memory, the bit lines are often jointly shared by all blocks so if a defect such as a locked state occurs on a specific bit line then that defect is a defect on all blocks.

If a breakdown occurs on the word lines/bit lines of the memory cell, then that affects the entire memory so merely replacing the block will not cure the defect.

SUMMARY OF THE INVENTION

This invention provides a semiconductor integrated circuit device and memory control method for reliably continuing operation while limiting functions even if a defect occurs in the flash memory.

An exemplary aspect of the semiconductor integrated circuit device of this invention includes a flash memory and flash control unit, and a processor. The flash control unit controls the reading and (re)writing on the flash memory. The processor unit commands the flash control unit to perform the verify operation after the flash memory was rewritten. This rewrite operation includes an erase operation to set a specified region of the flash memory to a non-written (blank) state. The processor unit includes a normal mode and a fail-safe mode as the operation states. In normal mode, all further usage of the memory is stopped when a defect is discovered in the verify operation performed after writing data on the flash memory. In fail-safe mode, errors are corrected and usage of the flash memory continues when a defect is discovered in the verify operation after data was written on the flash memory. The normal mode is the usual operation state, and the operation switches to fail-safe mode when a defect is discovered in the verify operation after erasing in normal mode.

Another exemplary aspect of this invention is a memory control method for a semiconductor integrated circuit device containing a flash memory, a flash control unit for controlling reading, and controlling rewriting on the flash memory, and a processor unit for commanding the flash control unit to perform the verify operation after rewriting the flash memory. The rewrite operation here includes an erase operation for setting a specified region on the flash memory to a blank state. The memory control method includes a normal mode operation step, a fail-safe mode operation step, and a shift step.

In the normal mode operation step, all further flash memory usage is stopped, when the verify operation detects a defect after data was written on the flash memory. In the fail-safe mode operation step, the error is corrected and usage of the flash memory continues even if the verify operation detects a defect after data was written on the flash memory. The shift step switches operation from normal mode to fail-safe mode when the verify operation detects a defect after the erase operation in the normal mode operation step.

In yet another aspect of this invention, a memory control program for controlling the flash memory in a processor unit in a semiconductor integrated circuit device includes: a flash memory, a flash control unit for controlling reading, and controlling rewriting on the flash memory, and a processor unit for commanding the flash control unit to perform the verify operation after data was rewritten onto the flash memory. The memory control program includes a normal mode operation sequence, and a fail-safe mode sequence.

The normal mode operation sequence includes a first data write sequence, a first data verify sequence, a first data erase sequence, and a first erase verify sequence, and stops further usage of the flash memory when the first data verify sequence detects a defect. In the first data write sequence data is written on the flash memory. The first data verify sequence verifies the data written on the flash memory. The first data erase sequence sets a specified area on the flash memory to a blank state. The first erase verify sequence verifies whether or not a blank state has been reached. The fail-safe mode sequence includes a second data write sequence, a second data verify sequence, a second data erase sequence, and a second erase verify sequence, and continues usage of the flash memory for error correction when the second data verify sequence detects a defect. The second data write sequence writes the data on the flash memory. The second data verify sequence verifies the data written in the flash memory. The second data erase sequence sets a specified area in the flash memory to a blank state. The second erase verify sequence verifies whether or not a blank state was set. When the first erase verify sequence detects a defect, the processor unit executes a sequence to shift to the fail-safe mode sequence.

This invention is capable of providing a semiconductor integrated circuit device and memory control method for reliably continuing operation while limiting functions even if a defect occurs in the flash memory.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Figure 1:
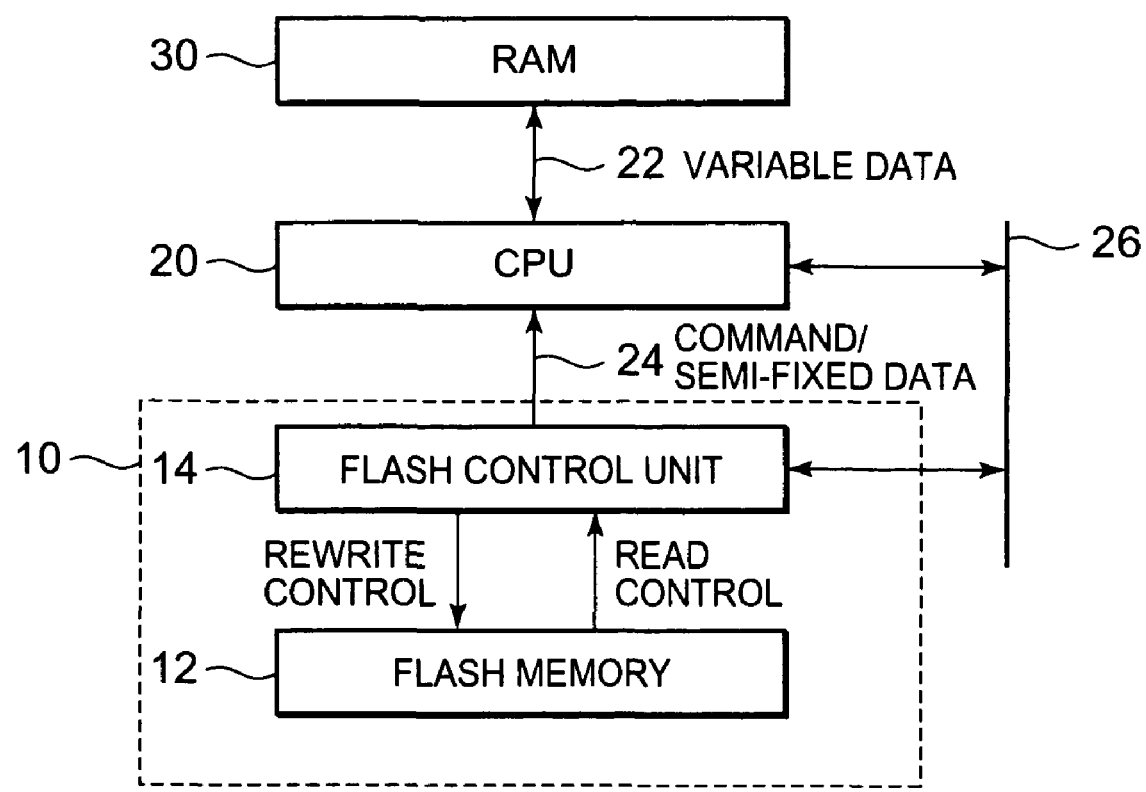
FIG. 1 is a block diagram showing a structure of a semiconductor integrated circuit device of a first exemplary embodiment of the invention.

FIG. 1 shows the structure of the microprocessor of an exemplary embodiment of this invention. The microprocessor contains a CPU (central processing unit) 20, a RAM (random access memory) 30, and a flash unit 10. The CPU 20 loads (read out) commands from the flash unit 10 by way of the bus 24, loads data for storage onto the RAM 30 and writes data such as processed data into the RAM 30 via the bus 22. Data that must be retained even if the power is not supplied is stored in the flash unit 10. This data is loaded and processed. The flash unit 10 contains a flash memory 12 for retaining data and a flash control unit 14 for controlling the reading and controlling the writing of the flash memory 12. Data stored in the flash unit 10 can be written and read out by way of the peripheral bus 26.

Figure 2:
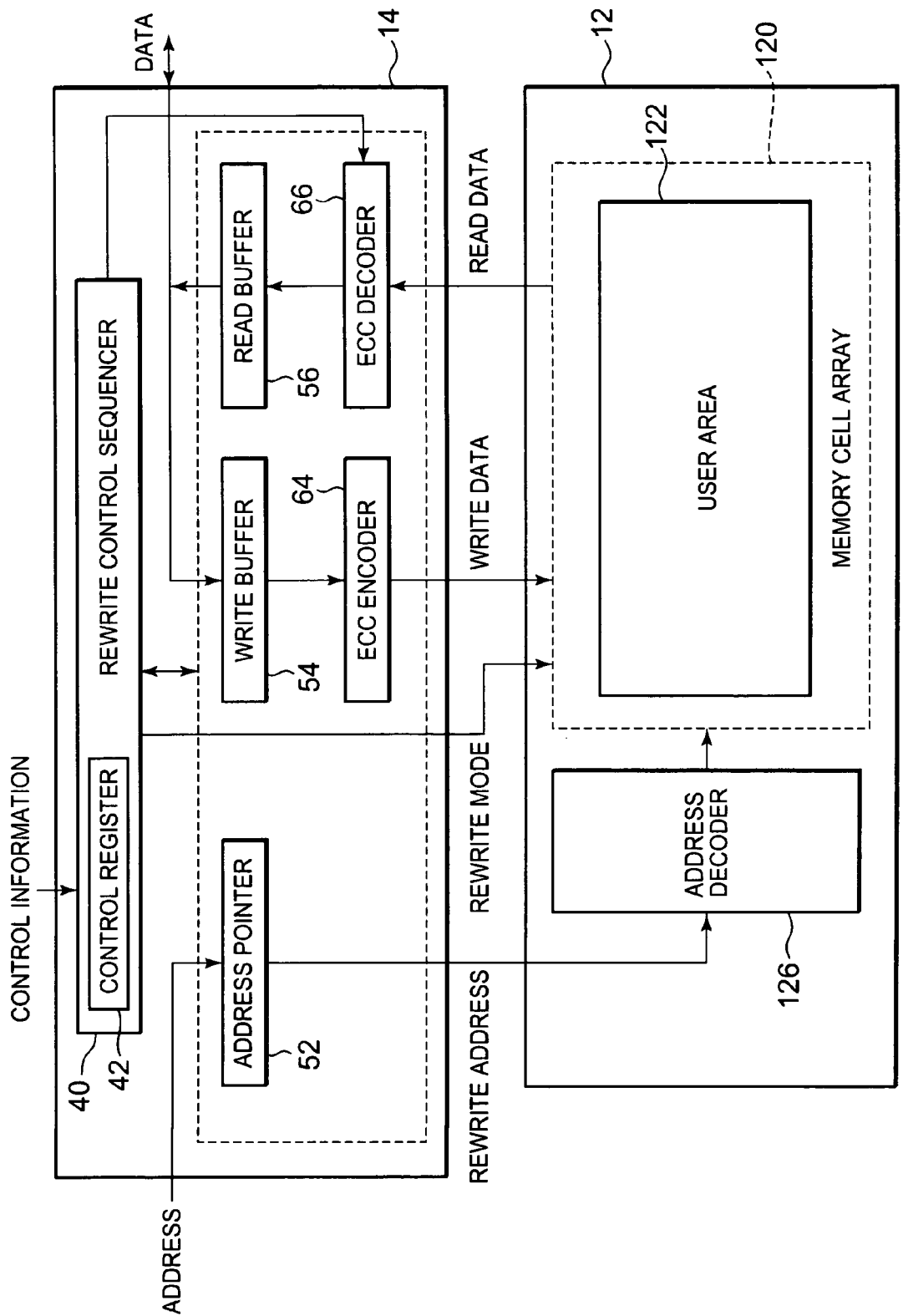
FIG. 2 is a block diagram showing an exemplary structure of a flash unit of the first embodiment of the invention.

FIG. 2 shows the structure of the flash unit 10 of the first embodiment of this invention. This figure shows the memory control method implemented by software in the first embodiment. The flash unit 10 of CPU 20 control is implemented by normal mode in usual operation and by fail-safe mode when a conflict is detected in the flash unit 10. The flash unit 10 includes a flash memory 12 for storing data, and a flash control unit 14 for controlling it. The flash memory 12 includes a memory cell array 120 for storing data, and an address decoder 126 for decoding the address of the memory cell array 120.

The flash control unit 14 contains a rewrite control sequencer 40, an address pointer 52, a write buffer 54, a read buffer 56, an ECC encoder 64, and an ECC decoder 66. The rewrite control sequencer 40 contains a control register 42, and sets control information specified from the CPU 20 into the control register 42, and controls the operation of every unit in the flash unit 10 based on that control information. The rewrite control sequencer 40 specifies a rewrite mode to the flash memory 12, and sets a decision threshold for judging the logic level of the signal loaded from the memory cell of the flash memory 12. The address pointer 52 stores the address of flash memory 12 specified by CPU 20, and supplies it to the flash memory 12. The write buffer 54 retains the write data into the flash memory 12, and supplies the write data into the flash memory 12 by way of the ECC encoder 64. The read buffer 56 retains the read data from the flash memory 12 via the ECC decoder 66, and supplies it to the CPU 20.

The ECC encoder 64 adds an ECC (error correcting code) to the data stored in the write buffer 54. When the data stored in the write buffer 54 for example is 32 bits, then the ECC encoder 64 adds six bits of ECC, and supplies this as 38 bits of data to the flash memory 12. The ECC decoder 66 supplies the error corrected data to the read buffer 56 based on data containing the ECC read out from the flash memory 12. The ECC decoder 66 is also capable of stopping the error correcting function and supplying the read data unchanged to the read buffer 56. The rewrite control sequencer 40 turns the error correcting function on and off.

The flash control unit 14 may also include a function to compare data stored in the write buffer unit 54, with data loaded unchanged from the flash memory 12 outputted from the ECC decoder 66, and notify the CPU of those comparison results.

Figure 3:
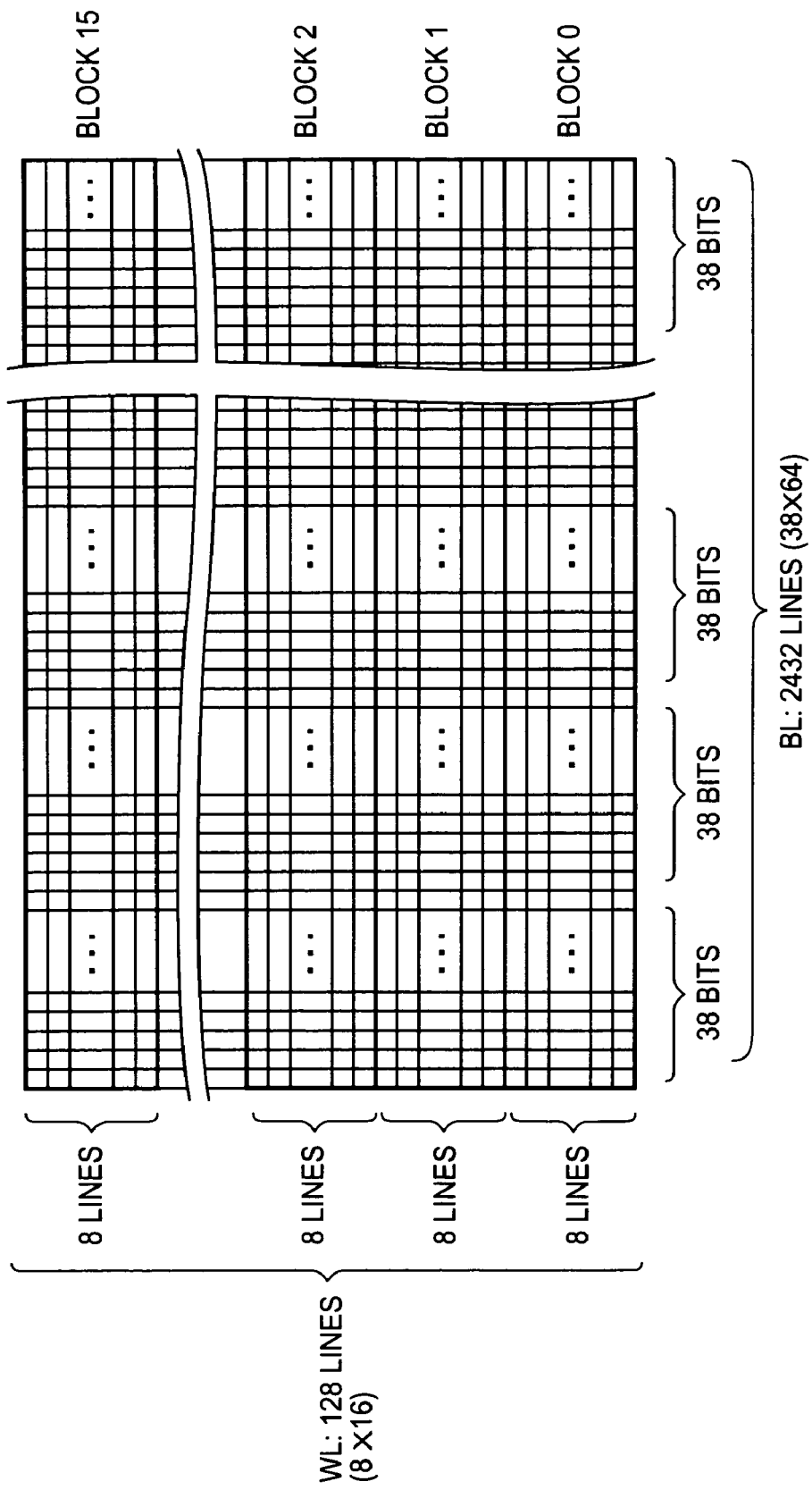
FIG. 3 is a diagram for describing an exemplary structure of a memory cell array.

All areas of the memory cell array 120 of flash memory 12 are utilized as the user area 122. If the memory cell array 120 contains a capacity for example of 32 kilobytes, then there are 128 word lines and 2432 bit lines as shown in FIG. 3. The memory cell array 120 is managed while sub-divided into 16 block segments. Each block therefore contains 8 word lines. The memory contents are also erased in block units. Six bits of ECC are added to 32 bits of data, and write and read performed in 38 bit units. In the memory cell array shown in FIG. 3, there are 64 groups of 38 bits, and 64 word portions of data are stored on identical word lines. These 64 word addresses are usually connected. As can be understood from the figure, when there is a conflict relating to the word lines, then the data on the connected addresses is defective. When there is a conflict relating to the bit lines, then the data for each 64 words is defective.

Figure 4:
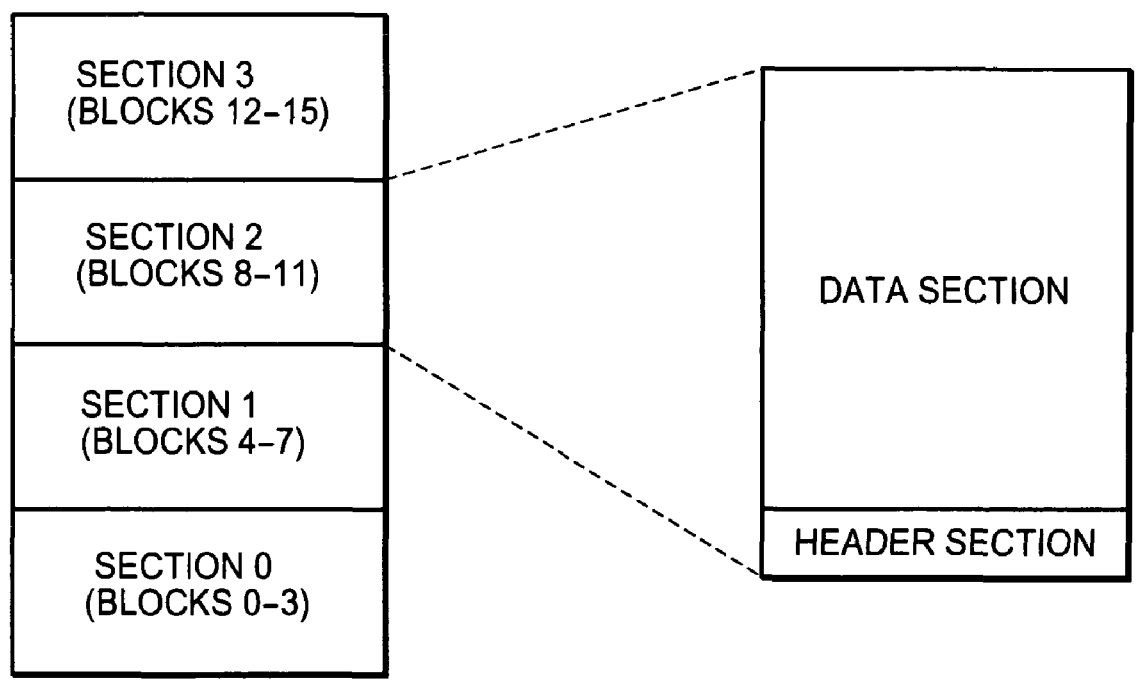
FIG. 4 is a drawing for describing exemplary sections of the memory cell array.

As shown in FIG. 4, the memory cell array 120 is logically controlled while sub-divided into 4 sections. Each section contains four blocks, and a data unit storing the user data, and a header unit storing information showing the section status. The header unit contains three-word flag information showing what type of state the section is in. Flag information is made up of one word each, and three addresses are respectively set on different word lines.

The first flag information shows each state as an erase state (erased) showing that data within that applicable section has been erased; an active state (activated) showing that the applicable section is available for use; an inactive state (consumed)

showing that usage of the applicable section has been stopped, and a defect (damaged) state showing that the applicable section cannot be used. Each flash memory cell becomes a "1" when the data is erased and so that erased state is shown in hexadecimal notation as 0xffffffff. The activated state is shown in the same way as 0x5555ffff, and the consumed state as 0x55555555. The damaged (or defect) state is 0x00000000.

The second flag information is a 16 bit count value, and shows the number of erasures of that section. An inverted value where 1 and 0 are reversed is attached to that count value, and stored in 32 bits. Errors in writing the count value can therefore be discovered if the count and the inverted value showing the erasure count do not match each other.

The third flag information is utilized as a spare for the first flag information and indicates a damaged (or defect) state showing 0x00000000 when first flag information is not ready (or not written), etc. Damaged sections can be found when either or both the first or the third flag information is showing a damaged state (0x00000000).

Figure 5:
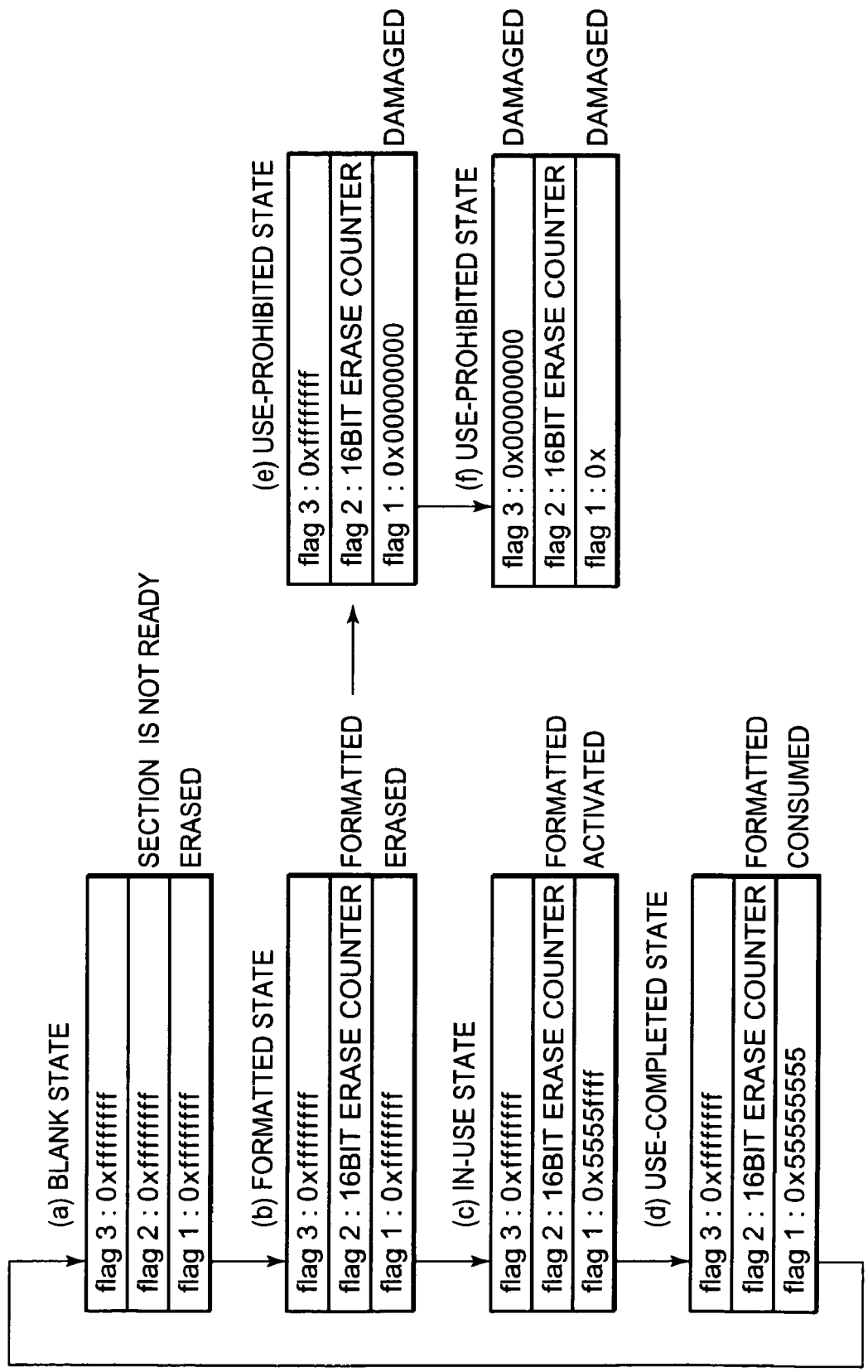
FIG. 5 is a chart for describing state of each section.

As shown in FIG. 5, the respective flag information shows whether the section is (a) blank state {not-ready}, (b) formatted state, (c) in-use state {activated}, (d) a use-completed state {consumed}, or (e) (f) use-prohibited state {damaged}. The stored data in a section is first of all erased to set it to a blank (unwritten) state (a). Each section becomes a (b) formatted state when the number of erasures (or erase count) is written as the second graph information. A session becomes a (c) in-use state when 0x5555 is written in the upper 16 bits of the first flag information. Data is then written in the data unit of that section and then used. When new data is written into a data unit and data can then no longer be written in that area, that section becomes a use-completed state, and 0x5555 is written in the lower 16 bits of the first flag information. These states from (a) to (d) are repeated during normal usage.

The section becomes an (e) use-prohibited state when a conflict is discovered in that section. Writing the first flag information might not be possible, and in that case a use-prohibited (or damaged) state (0x00000000) is written in the third flag information to set the (f) use-prohibited state. These different flag information are not allotted to addresses on the same word lines so an abnormal state can be judged from any of these flag information.

Figure 6:
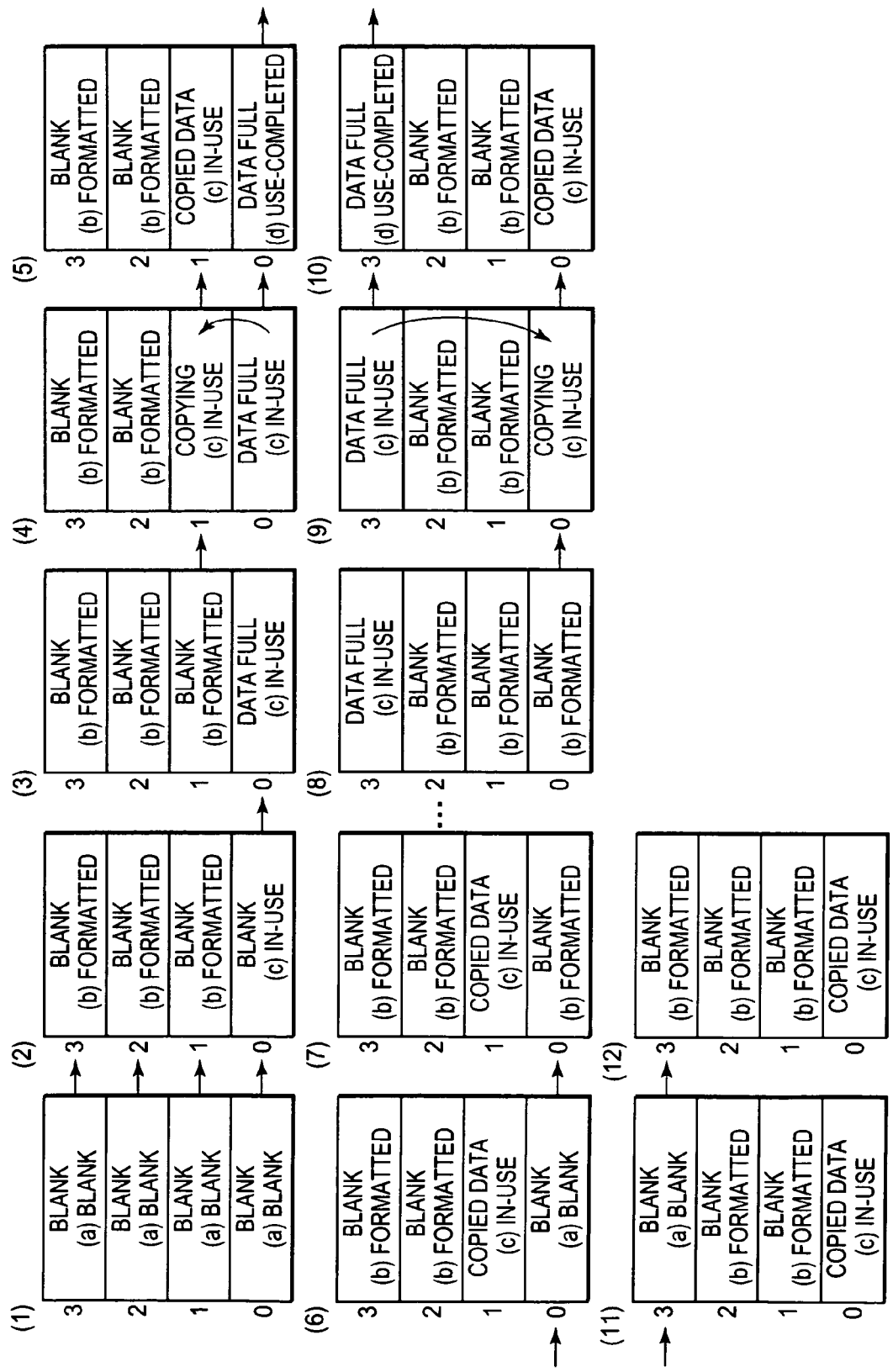
FIG. 6 is a drawing for describing a section operation (normal operation)

Therefore during normal mode as shown in FIG. 6, normal writing and erasing is executed in sequence on each section. In other words, at the start of use of the microprocessor containing this flash memory, each section is in the (a) blank state as shown in (1) of FIG. 6. The CPU 20 sets the erasure count or number of erasures in the flag information of the header unit in each section, and sets the format to the (b) formatted state. The CPU 20 sets the flag information for section 0 to the enabled state, and as shown in (2) of FIG. 6, sets a (c) in-use state and starts usage of section 0. Data is then added to section 0 in the (c) non-use state. Data rewrite is performed by writing on a new area so that the write area on section 0 is no longer available as shown in (3) of FIG. 6.

As shown in (4) of FIG. 6, the CPU 20 sets section 1 to the (c) in-use state to copy (write) the valid data among data stored in section 0, onto section 1. When copying is complete as shown in (5) of FIG. 6, the flag information on section 0 is set to the (d) consumed state (or data full). The data in section 0 is erased during writing of user data on section 1. The header unit is also erased so that section 0 is set to the (a) not ready or blank state shown in (6) of FIG. 6. The erasure count is set in the flag information for section 0, and section 0 as shown in (7) of FIG. 6 is now in the (b) blank (or formatted) state. Each section is utilized in this sequence.

As shown in (8) of FIG. 6, when the write area in section 3 is no longer available, the next section for use becomes section 0, and as shown in (9) of FIG. 6, the valid data in section 3 is copied into section 0. When copying is completed, section 3 is set to the (d) data full state as shown in (10) of FIG. 6. Then, as shown in (11) of FIG. 6, section 3 is erased and set to the (a) blank or formatted state during use of section 0, and an erase count incremented one time is set into the header unit, and set to the (b) formatted state as shown in (12) of FIG. 6.

Figure 7:
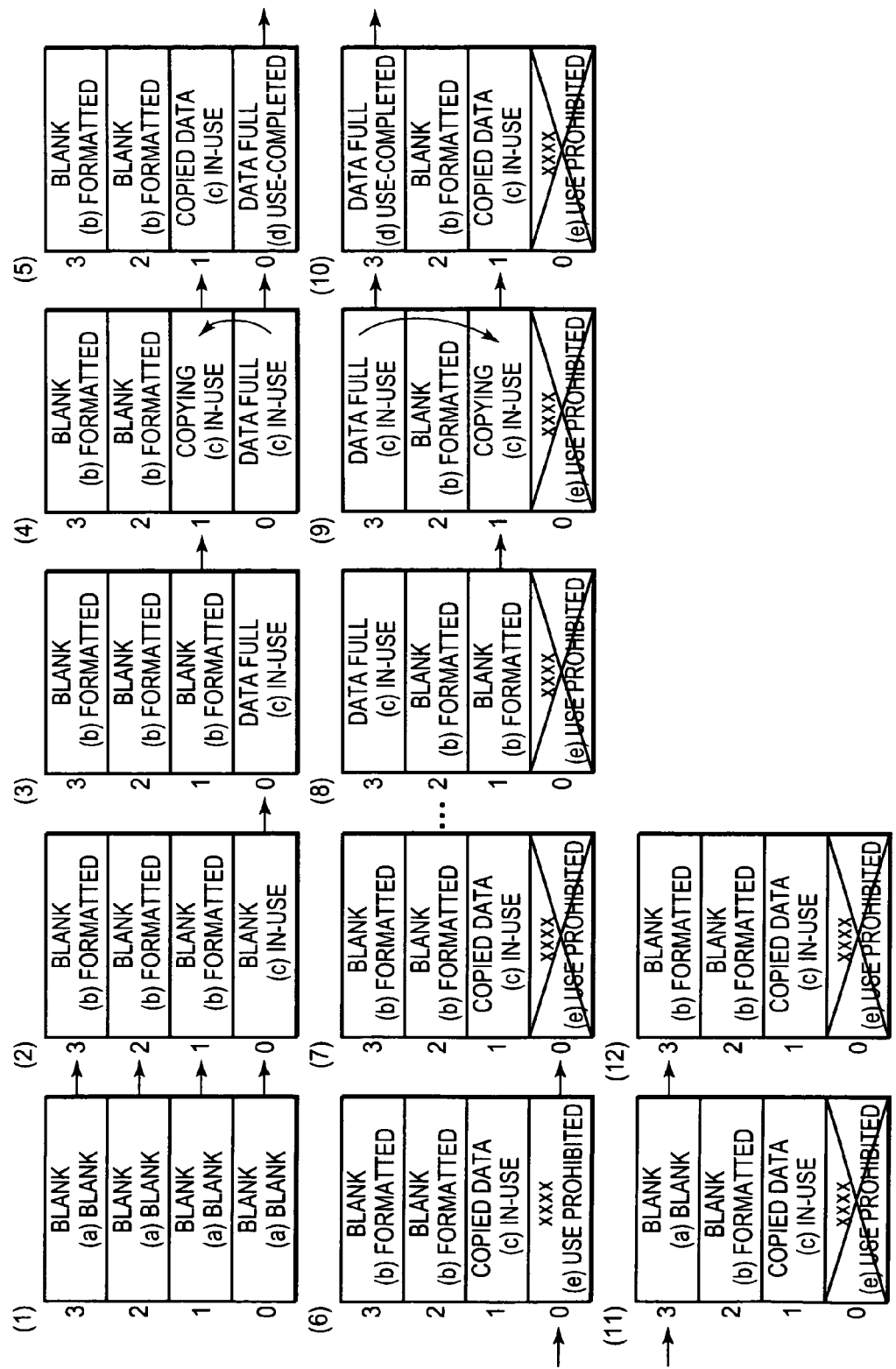
FIG. 7 is a drawing for describing a section operation (during errors)

The case where detecting a conflict and shifting to fail-safe mode when the data stored in section 0 is described while referring to FIG. 7. If the states of each section from (1) through (5) of FIG. 7 are the same as from (1) through (5) of FIG. 6, then use of section 0 proceeds and section 0 is set to the (d) data full state. A conflict is detected when attempting to erase the data stored in section 0. The valid data among the data in section 0 has already been copied into section 1 so that data remaining in section 0 is invalid, and does not adversely affect the microprocessor operation. However as shown in (6) of FIG. 7, this section 0 cannot be used and so is set to the (e) damaged state, and memory control switches to the fail-safe mode. The section 0 is not usable so section 1 is utilized as usual as shown in (7) of FIG. 7. The sections are used in order, and as shown in (8) of FIG. 7, when section 3 is full, then the section 1 is used next as shown in (9) of FIG. 7. The valid data in section 3 is copied into section 1 ((9) of FIG. 7), and section 3 (d) is set to the consumed or data full state ((10) of FIG. 7). The data is then erased and section 3 set to the (a) blank state ((11) of FIG. 7), the erase count is then set and the (b) formatted state is set ((12) of FIG. 7). Sections 1 through 3 are thereafter used except for section 0, and the microprocessor operation continues.

Figure 8:
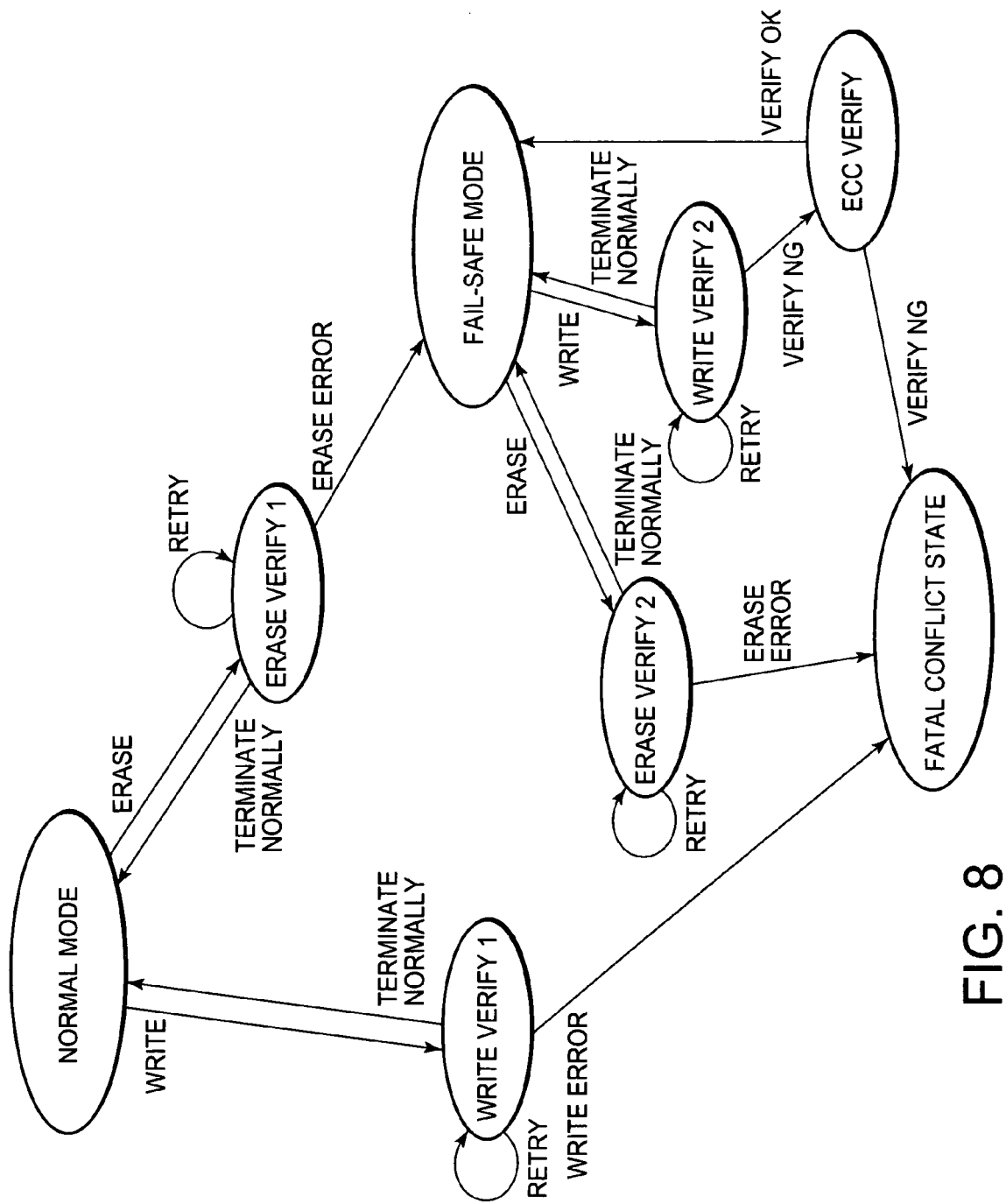
FIG. 8 is a drawing showing state transitions in the operation of a processor unit.

The state transitions for memory control are shown in FIG. 8. Data is usually written in the flash memory 12 in normal mode. Whether data is written correctly or not is confirmed in write verify 1. The write verify 1 confirms that there is write data, then the processing ends normally and returns to the standby state. If there is a defect in the writing then a retry is made, and if writing is still defective, then a fatal conflict state is reached.

When a write area is no longer available in the write section while writing data in normal mode, then the write section is shifted to the next section, and the original write section is erased. The erase verify 1 process then confirms the data erasure. If not erased sufficiently, then an erase retry is made. The process returns to normal mode 1 when erase verify 1 confirms the erasure. If still not erased sufficiently even after a retry, then a shift is made to fail-safe mode. Sections that are not sufficiently erased at this time are set to the use-prohibited state.

If the erase is inadequate in fail-safe mode then an erase retry is made the same as in normal mode, and if retry terminates normally then the operation is continued. If erase is still inadequate even after a retry then that section is set to the use-prohibited state, and there are two defect sections at this time so a fatal conflict state is set.

When writing data in fail-safe mode, the write verify 2 is performed to confirm whether the data was written correctly, the same as in normal mode. Operation returns to fail-safe mode when the write verify 2 confirms the write data. If the writing is defective then a retry is made, and if the writing is still defective then the ECC function is enabled and verifying performed (ECC verify). In other words, if there is a one bit error in the 38 bits of one word in the memory then the 32-bit user data can be error corrected and restored so that defects and errors on the bit line can be corrected. If the write data cannot be matched even after enabling the ECC function and using write verify, then a fatal conflict state is set.

Figure 9:
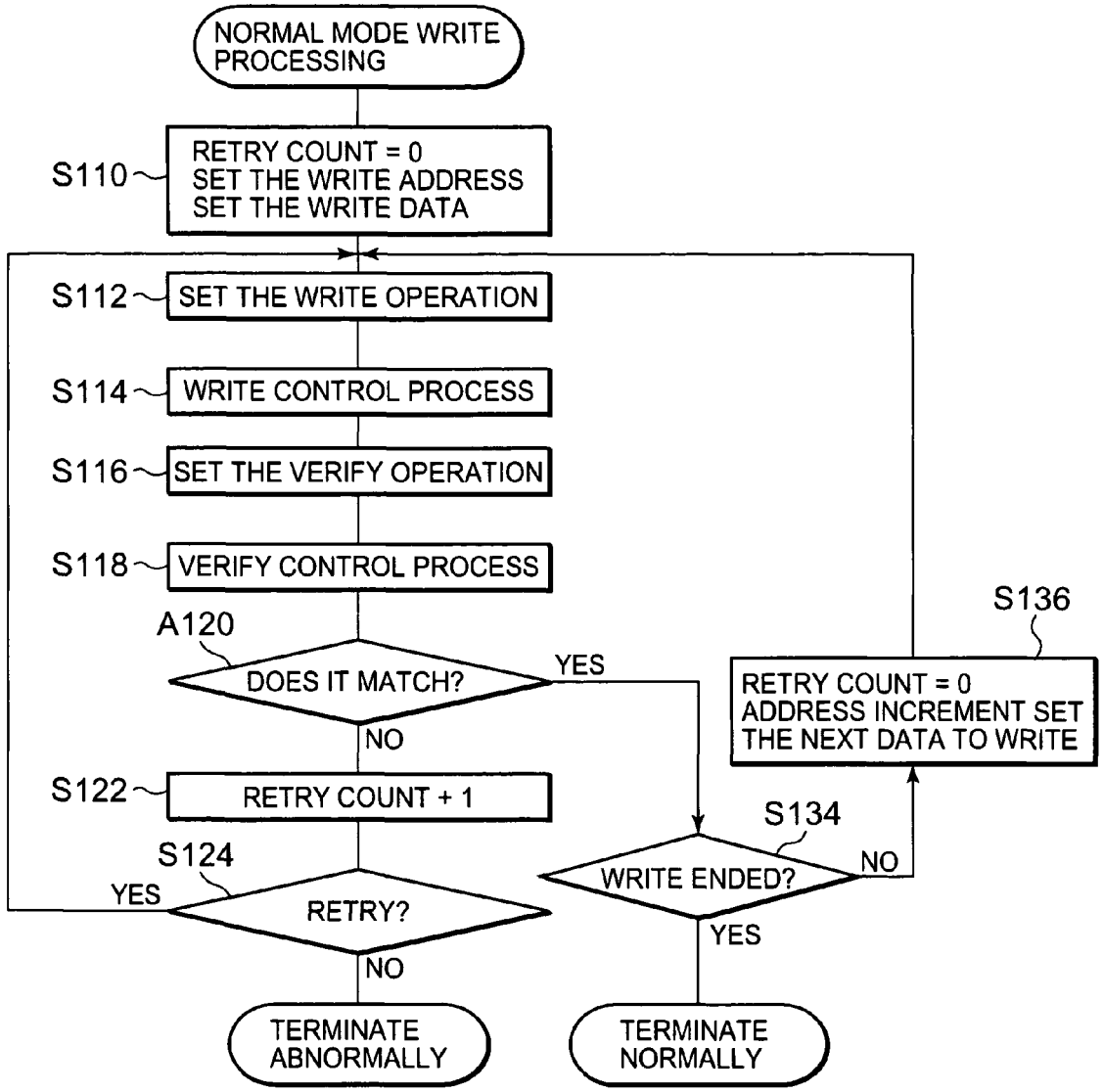
FIG. 9 is a flow chart showing a write process operation in normal mode.

The flash memory access operation of the microprocessor is described next while referring to the drawings. FIG. 9 is a flow chart showing the operation in the process for writing data in normal mode.

When writing data on the flash memory 12, the CPU 20 resets the retry count as part of the initializing, sets the write start address in the address pointer 52, and sets the write data into the write buffer 54 (step S110).

The CPU 20 next sets the control information for specifying the write operation, into the control register 42 of the rewrite control sequencer 40, and instructs the rewrite control sequencer 40 to write the data (step S112). The rewrite control sequencer 40 writes the data set in the write buffer 54 into the address set in the address pointer 52. The CPU 20 then stands by (waits) for the data writing to end (step S114). The ECC encoder at this time adds the ECC attachment information to the data set in the write buffer 54 and outputs it to the memory cell array 120.

When data writing ends, the CPU 20 sets control information into the control register 42 instructing it to perform the write verify operation, and commands the rewrite control sequencer 40 to perform write verify (step S116). The rewrite control sequencer 40 reads out the data and sets it in the write buffer 56, and verifies the written data (step S118). The read data is set in the read buffer 56 without being error-corrected. The rewrite control sequencer 40 at this time sets a verify value as a threshold for judging the logic level of the read out signal output from the memory cell array 120. This threshold is a stricter value than the normal data readout threshold value.

The CPU 20 judges the verify results (step S120). If this comparison includes the ECC attachment information, then the comparison is preferably made within the flash controller unit 14. The CPU 20 may also make the comparison. All bits are merely compared at this time and the ECC makes no error corrections. If it is a match (step S120-Yes) then the CPU 20 decides whether all the data was written (step S134). If there is write data (step S134-No), then the retry count is reset, the write address is updated, set in the address pointer 52, and the write data set in the write buffer 54 (step S136). The process is repeated from step S112. The write process terminates normally when all data is written (step S134-Yes).

If the verify results show a mismatch between the write data and the read data (step S120-No), then the retry count is updated (step S122), and if within the allowable count (step S124-Yes), then the process is repeated again from step S112. If this retry count exceeds the allowable count (step S124-No), then the processing ends abnormally as a write error. The process for handling write errors is not directly related to this invention so a description is omitted here.

Figure 10:
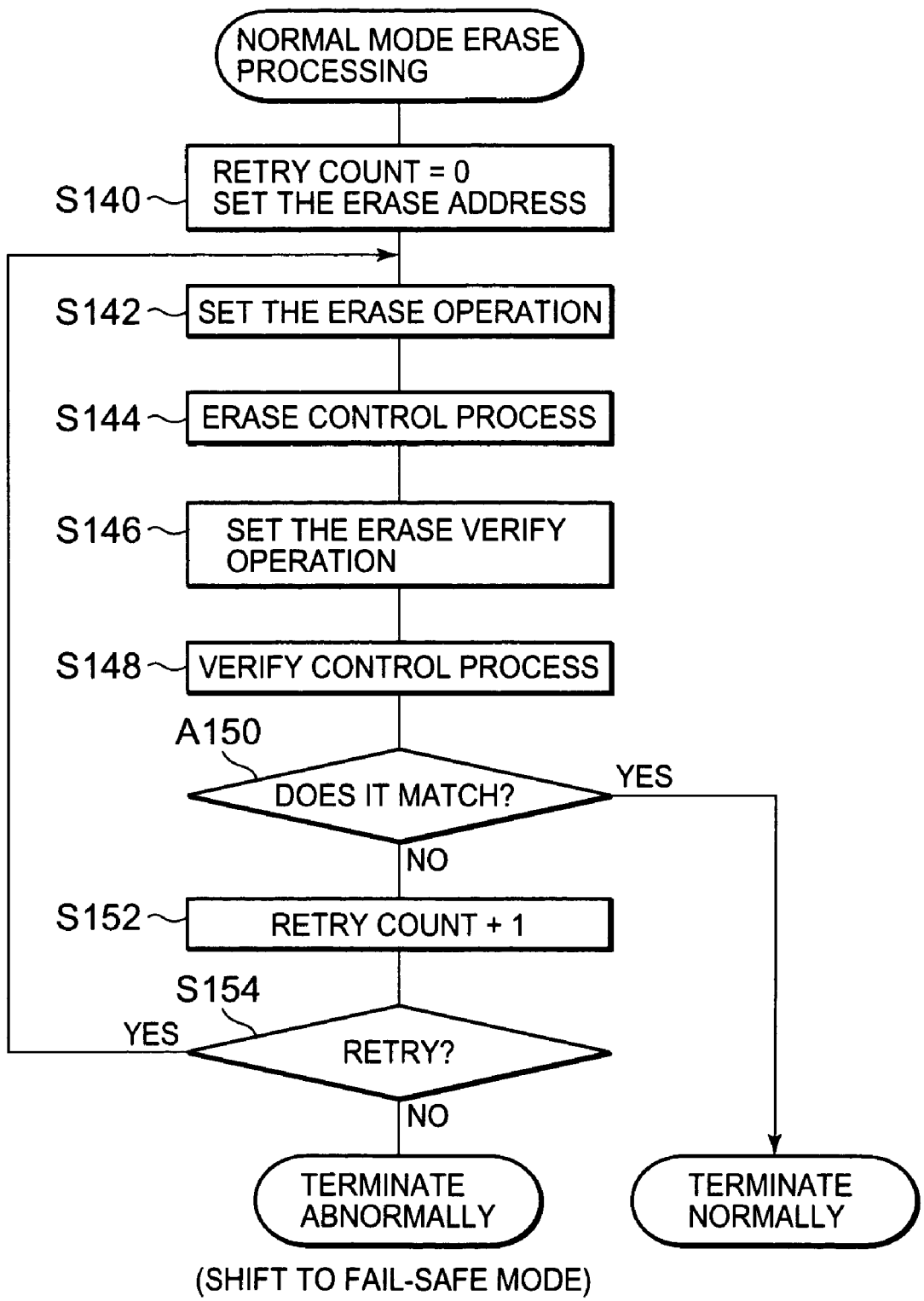
FIG. 10 is a flow chart showing an erase process operation in normal mode.

The erase process in normal mode is described next while referring to FIG. 10. Data on the flash memory 12 is erased in sections. The CPU 20 resets the retry count, and sets the address area for erasure into the address pointer 52 (step S140).

The CPU 20 next sets control information into the control register 42 commanding the data erase operation, and commands the rewrite control sequencer 40 to erase the data (step S142). The rewrite control sequencer 40 erases the data based on the address set in the address pointer 52, and the CPU 20 stands by (waits) for data erasure to end (step S144).

When data erasure ends, the CPU 20 sets control information into the control register 42 commanding the erase verify operation and commands the rewrite control sequencer 40 to perform erase verify (step S146). The rewrite control sequencer 40 at this time sets an erase state decision value as a threshold for judging the logic level of the read out signal output from the memory cell array 120. This threshold value is made a stricter value than the usually read out threshold value in order to be able to reliably confirm the erase state. The rewrite control sequencer 40 decides the read out signal level from this threshold value, and sets the read data into the read buffer 56. This data set in the read buffer 56 is compared with the all "1" data (step S148). The "1" state of this data is the erase state. The comparison is made here with 38-bit data including ECC attachment information.

The CPU 20 decides whether or not an erase state has been set (step S150). If all the bits are set to the all "1" erase state (step S150-Yes), then the process terminates normally. If even one bit is not completely in the erase state (step S150-No) then the retry count is updated (step S152). If that retry count is within the allowable count number (step S154-Yes), then the erase process is completed. If that retry count exceeds the allowable count (step S154-No) then the process ends abnormally as an erase error. The section including this area with the erase error is set to the use-prohibited state. The operation shifts from normal mode to fail-safe mode at this time.

Figure 11:
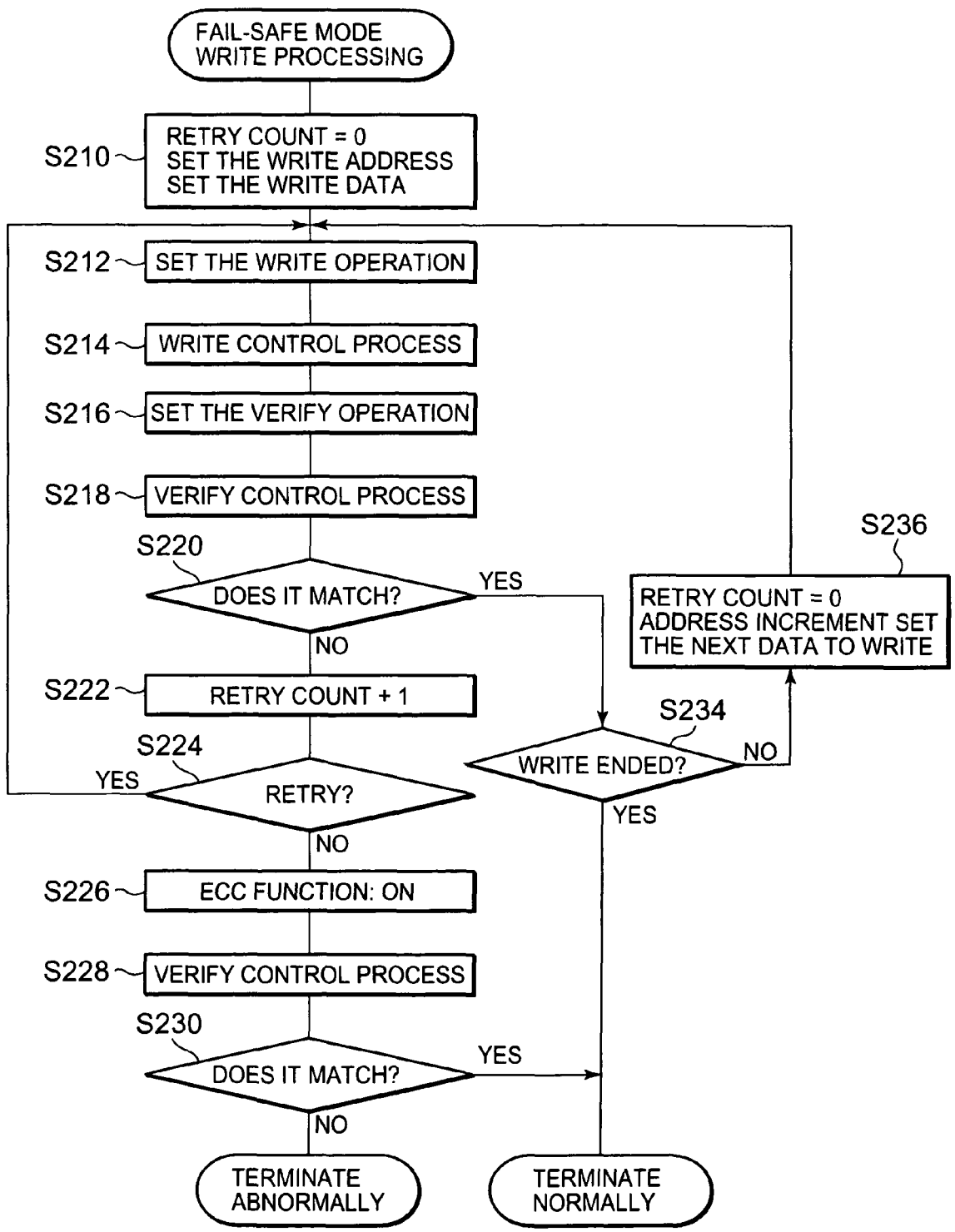
FIG. 11 is a flow chart showing a write process operation in fail-safe mode.

FIG. 11 is a flow chart showing the write process for fail-safe mode. The write process in fail-safe mode differs from the write process in normal mode in that error correction is performed by the ECC.

When data is written into the flash memory 12 in fail-safe mode, the CPU 20 resets the retry count, sets the write start address into the address pointer 52, and sets the write data into the write buffer 54 (step S210).

The CPU 20 next sets control information into the control register 42 of rewrite control sequencer 40 commanding the write operation, and commands the rewrite control sequencer 40 to write the data (step S212). The rewrite control sequencer 40 writes the data set in the write buffer 54 into the address set in the address pointer 52, and the CPU 20 stands by (waits) for data write to end (step S214). The ECC encoder at this time adds the ECC attachment information to the data set in the write buffer 54 and outputs it to the memory cell array 120.

When data writing ends, the CPU 20 sets control information into the control register 42 instructing it to perform the write verify operation, and commands the rewrite control sequencer 40 to perform write verify (step S216). The rewrite control sequencer 40 reads out the data and sets it in the write buffer 56, and compares it with the written data (step S218). The read out data is set into the read buffer 56 without being error corrected. The rewrite control sequencer 40 at this time sets a verify value as a threshold for judging the logic level of the read out signal output from the memory cell array 120. This threshold is a stricter value than the normal readout threshold value.

The CPU 20 decides whether the write data matches the read data or not (step S220). If this comparison includes the ECC attachment information, then the comparison is preferably made within the flash controller unit 14. The CPU 20 may also make the comparison. All bits are merely compared at this time and the ECC makes no error corrections. If the data is a match (step S220-Yes) then the CPU 20 decides whether all the data was written (step S234). If there is write data (step S234-No), then the retry count is reset, the write address is updated, set in the address pointer 52, and the write data set in the write buffer 54 (step S136). The process is repeated from step S212. The write process terminates normally when all data is written (step S234-Yes).

If the verify results show a mismatch between the write data and the read data (step S220-No), then the retry count is updated (step S222), and if within the allowable count (step S224-Yes), then the process is repeated again from step S212. If this retry count exceeds the allowable count (step S224-No) then the ECC function is enabled to correct the write error in the memory cell of the applicable address (step S226). The ECC function restores the main section of the data (32 bits) of this read out data (38 bits) based on the attached information. This ECC function is capable of restoring errors that are one bit errors, and cannot restore errors that are two or more bits. If the error is related to a bit line that is one bit, then this ECC function can restore it. The rewritten data is then verified while in a state with the ECC function enabled (step S228).

The process terminates normally when the write data (32 bits) matches the read data (32 bits) (step S230-Yes). If a mismatch (step S230-No), then correction is impossible even with the ECC function enabled so the process ends abnormally as a write error.

If the ECC function is always enabled during the write operation then memory cells with poor write characteristics might be restored by the ECC function which is not desirable. The ECC function is therefore disabled, write retries made, and the ECC function enabled to correct errors when the retries exceed the allowable (retry) count. The erase procedure in fail-safe mode is the same as in normal mode except that when the process ends abnormally a fatal conflict state is set rather than fail-safe mode.

Figure 12:
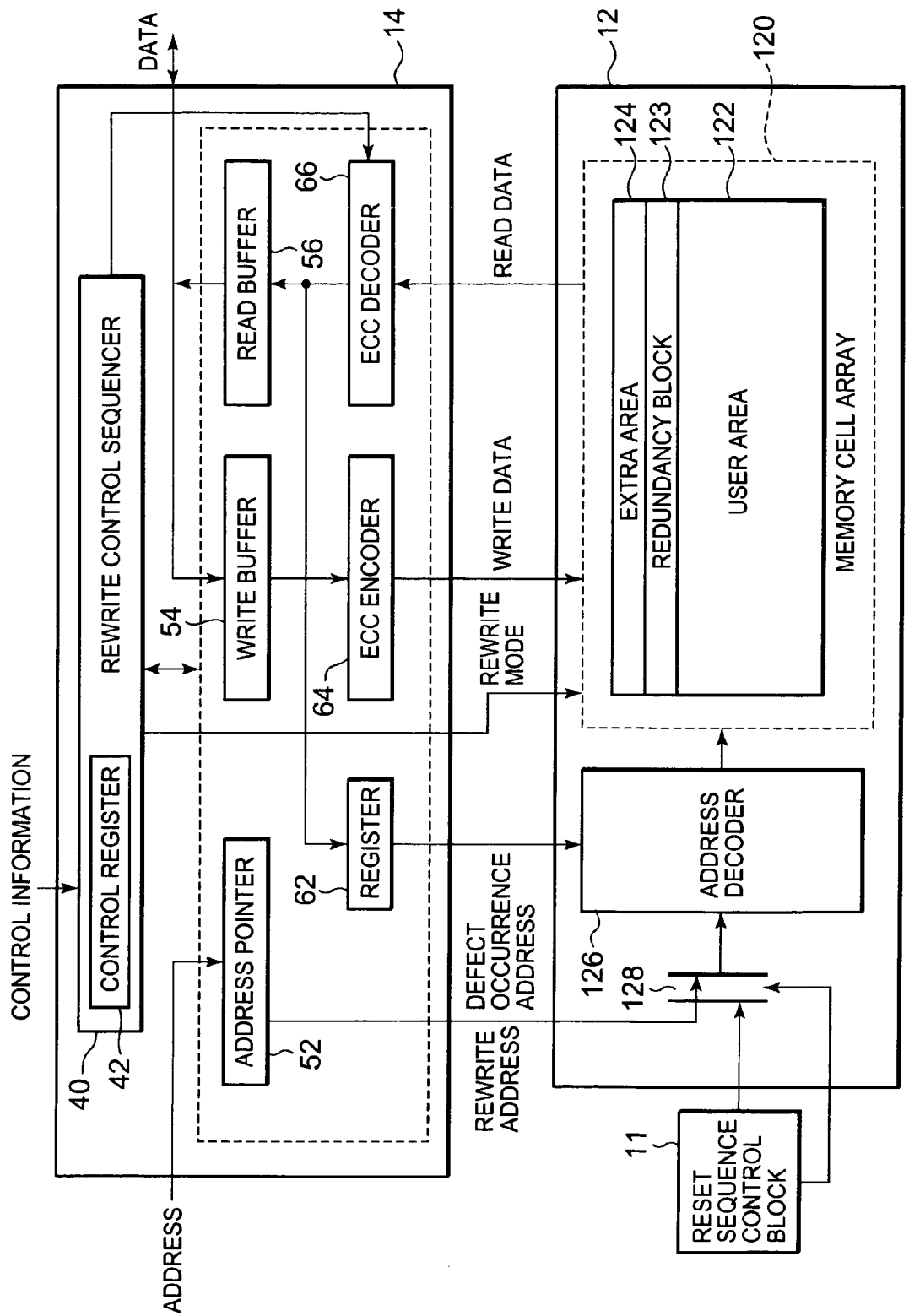
FIG. 12 is a flow chart showing the exemplary structure of the flash unit in the second embodiment of the invention.

FIG. 12 shows the structure of the flash unit 10 of the second embodiment of this invention. The memory control method shown for the second embodiment utilizes hardware. The flash unit 10 of CPU 20 is controlled in normal mode which is the usual operating mode, and in fail-safe mode when a conflict is detected in the flash unit 10. The flash unit 10 includes a flash memory 12 for storing data, and a flash control unit 14 for controlling the flash memory 12, and a reset sequence control unit 11 for controlling the operation during reset.

The flash memory 12 includes a memory cell array 120 for storing data and an address decoder 126 for decoding the address in the memory cell array 120, and a selector 128. The memory cell array 1.20 includes a user area 122 where user data is stored, and a redundancy block 123, and an extra area for storing the redundancy information. The selector 128 switches the address supplied to the address decoder 126 in order to extract the redundancy information during reset.

The flash control unit 14 includes a rewrite control sequencer 40, an address pointer 52, a write buffer 54, a read buffer 56, and ECC encoder 64, an ECC decoder 66, and a register 62. The rewrite control sequencer 40 includes a control register 42, and sets the control information commanded by the CPU 20 into the control register 42, and based on that control information, controls the operation of each unit of the flash unit 10. The rewrite control sequencer 40 also commands the flash memory 12 to use rewrite mode, and sets a judgment threshold (value) for judging the logic level of the signal read from the memory cell of the flash memory 20. The address pointer 52 stores the address of the flash memory 12 commanded by the CPU 20, and supplies it to the flash memory 12. The write buffer 54 stores the write data for the flash memory 12 and supplies the write data by way of the ECC encoder 64 to the flash memory 12. The read buffer 56 inputs and retains the read data from the flash memory 12 by way of the ECC encoder 66, and supplies it to the CPU 20.

The ECC encoder 64 attaches the ECC to the data stored in the write buffer 54. When the data stored in the write buffer 54 for example is 32 bits, six bits of ECC are then attached, and supplied as 38 bit data to the flash memory 12. The ECC decoder 66 supplies error corrected data based on data including the ECC read out from the flash memory 12, to the read buffer 56. The ECC decoder 66 is also capable of stopping the error correcting function and supplying the read data unchanged to the read buffer 56.

The register 62 retains the redundancy information read from the extra area 124 of memory cell array 120 during reset. The register 62 controls the area in the memory cell array 122 based on this redundancy information. The flash control unit 14 may also compare data stored in the retry buffer 54 with data read out unchanged from the flash memory 12 output from the ECC decoder 66, and notify the CPU of the comparison results.

The reset sequence control unit 11 starts up before cancelling reset of the CPU 20, and controls the selector 128 to supply the address of the extra area 124 to the address decoder 126. The reset sequence control unit 11 read (loads) the redundancy information stored in the extra area 124 and retains it in the register 62.

The memory cell array 120 of flash memory 12 contains a user area 122, a redundancy block 123 and an extra area 124. As shown in FIG. 3, the user area 122 is managed in 16 block segments. The erase process erases the data in all at once in block units. In order to simplify the description, the erasure here is carried out in sections with one section containing four blocks. The redundancy block 123 is the same capacity as this one section and can be substituted for any of the four sections. Setting the redundancy block 123 to essentially the same capacity as one block allows substituting just one block within a section. In that case, a small area may be secured for the redundancy block 123 and prove effective. Moreover, multiple redundancy blocks may be provided.

The extra area 124 is substituted for a defect block occurring in the user area 122 and redundancy block 123 and therefore holds redundancy information such as the address where the defect occurred. Redundancy information is generated when a defect occurs and besides being stored in the extra area is also set in the register 62. The address decoder 126 changes the address decoding of the user area 122 to access the redundancy block 123 instead of the block where the defect occurred.

The flag information for managing the sections in the user area was described in the first embodiment so a description is omitted here. The memory cell array 120 operation in normal mode is also performed in the order of write and erase as described for the first embodiment while referring to FIG. 6, so a detailed description is omitted here.

Figure 13:
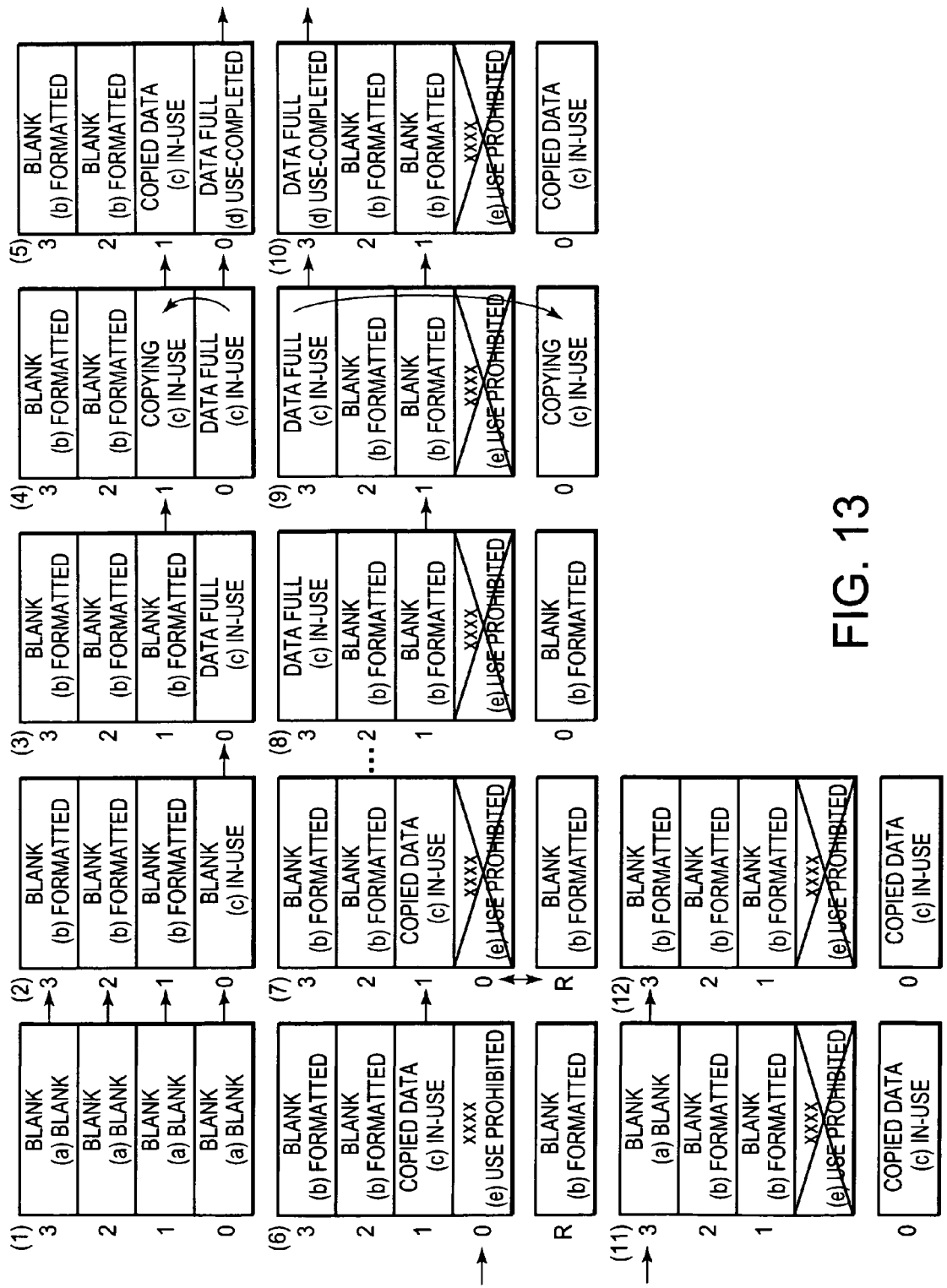
FIG. 13 is a drawing for describing a section operation (during errors)

The detection of a conflict occurring when erasing data stored in section 0 and shifting to fail-safe mode in the present embodiment is described next while referring to FIG. 13. The states of each section from FIG. 13 (1) through FIG. 13 (5) are the same as the states from FIG. 6 (1) through FIG. 6 (5), and the process proceeds in section 0, and section 0 is the (d) use-completed state of section 0. A conflict is detected when attempting to erase data stored in the section 0. The valid data among data in section 0 is already copied onto section 1 so data remaining in section 0 is invalid and does not adversely affect the microprocessor operation. However this section 0 cannot be used and so as shown in FIG. 13 (6), section 0 is set to the (e) use-prohibited (or damaged) state, and memory control shifts to the fail-safe mode. The address where the defect occurred is notified to the address decoder 126, and the address decoder 126 then changes that address so that redundancy block 123 is accessed when that (defect) address is specified from that point onwards (FIG. 13 (7)). The user is under the impression that usage of section 0 continues and is not aware that use was shifted to the redundancy block 123 instead of this section 0. The redundancy block 123 is utilized as section 0 from FIG. 13 (8) onwards so when section 3 becomes full, then section 0 (redundancy block 123) is next used as shown in FIG. 13 (9), and the valid data from section 3 is copied to section 0 (redundancy block 123). Section 3 is set to the (d) use-completed state as shown in FIG. 13 (10), and the data then erased to attain an (a) blank state (FIG. 13 (11)), the erase count is set, and the (b) formatted (blank) state set (FIG. 13 (12)). The redundancy block 123 is hereafter utilized as section 0, and the microprocessor operation continues.

Figure 14:
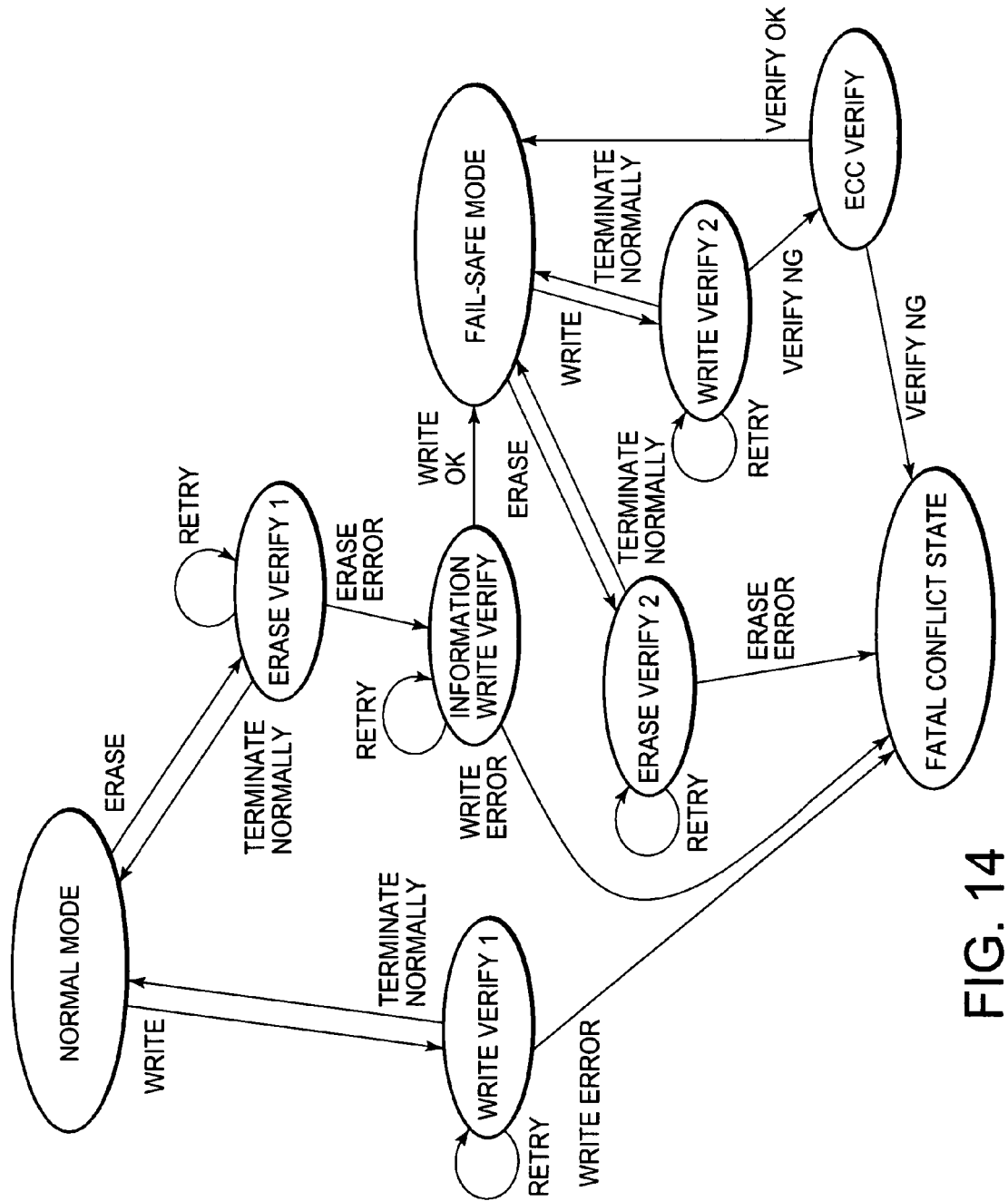
FIG. 14 is a drawing showing state transitions in an operation of the processor unit.

FIG. 14 shows state transitions during the memory control. In normal mode data is usually written in the flash memory 12. The write verify 1 confirms whether the data was written correctly. When the write verify 1 confirms the write data, the process terminates normally and returns to the standby state. If the writing is defective then retries are performed and if still defective then this write defect is set as a fatal conflict state.

During writing in normal mode, when a write area is no longer available in the write section then the write section shifts to the next section. The original write section is erased and the erase verify I confirms the data erasure. However if erasure is incomplete then erase retries are made. Operation returns to normal mode when the erase verify 1 confirms the erasure. If erasure is still not complete even after retries, then information such as that defect address is written into the extra area 124 as redundancy information. If the information write verify operation indicating that redundancy information, cannot confirm that the redundancy information was written correctly even after retries, then a fatal conflict state is set. If the writing was correct then operation shifts to fail-safe mode. Since a shift was made to fail-safe mode due a data erase defect, after shifting to fail-safe mode, the redundancy block 123 is used instead of the section where the erase defect occurred.

Erasure in fail-safe mode is the same as in normal mode in that retries are made if erasure is incomplete and the operation continues is erasure terminates normally. However, if erasure is still incomplete even after retries, then that section is set as use-prohibited but at this time there are two defect sections so that the state is set as a fatal conflict state.

Data write in fail-safe mode is the same as in normal mode in that Write Verify 2 confirms whether the data was written correctly. Operation returns to fail-safe mode when the Write Verify 2 confirms the write data. Retries are made if the writing is defective, and if still defective after retries then the ECC function is enable and verify performed (ECC verify). In other words, if there is a one bit error among 38 bits for one word in the memory then the user data can be corrected and restored so that defects involving the bit line can be corrected. If a match in the write data cannot be confirmed even by write verify after the ECC function was enabled then a fatal conflict state is set. If ECC verify confirms that the error correction is okay then operation returns to fail-safe mode and usage of that memory continues.

The operation for accessing the flash memory of the microprocessor is described next while referring to the drawings. The data write process in fail-safe mode and the data write process in normal mode are the same as the first embodiment so a description is omitted here.

Figure 15:
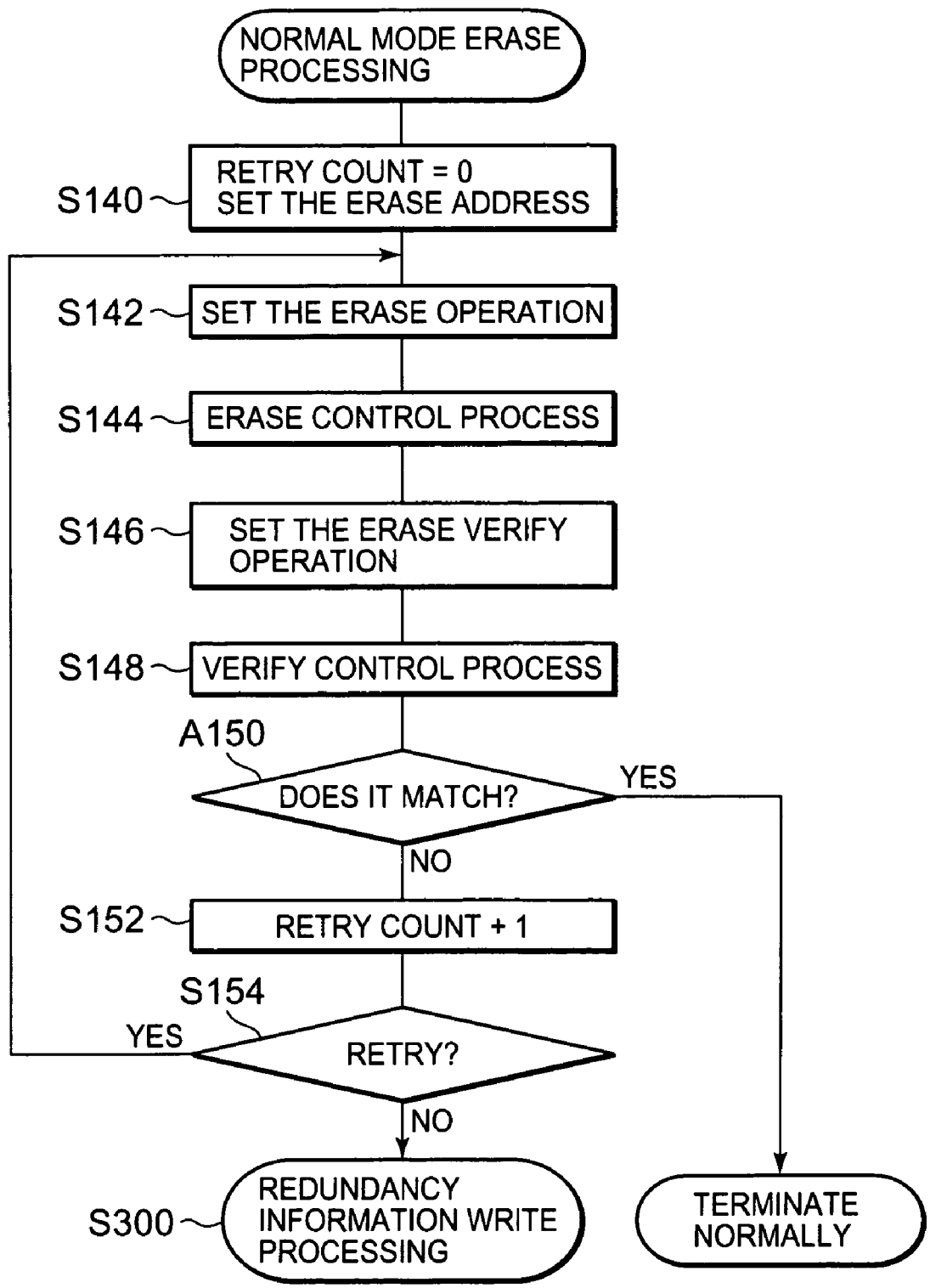
FIG. 15 is a flow diagram showing an erase process operation in normal mode.

FIG. 15 is a flow chart showing the erase process operation in normal mode. Data on the flash memory 12 is erased in specified units at a time. The CPU 20 resets the retry count, and sets the address of the area for erasure into the pointer 52 (step SI 40).

The CPU 20 next sets control information commanding the erase operation into the control register 42, and commands the rewrite control sequencer 40 to erase the data (step S142). The rewrite control sequencer 40 erases the data based on the address set in the address pointer 52, and the CPU 20 awaits the completion of data erasure (step S144).

When erasing of data is completed, the CPU 20 sets control information into the control register 42 commanding the erase verify operation and commands the rewrite control sequencer 40 to perform erase verify (step 146). The rewrite control sequencer 40 at this time sets a threshold value for deciding the logic level of the read signal that was output from the memory cell array 120, as a value for judging the erase state. This threshold value is a stricter value than the threshold value normally used when during read for confirming that the erase state is complete. The rewrite control sequencer 40 judges the read signal level from this threshold value and sets the read data into the read buffer 56. The data set in this read buffer 56 is compared with the all "1" data (step S148). The "1" state data indicates an erasure state. The 38 bit data including ECC attachment information is compared here.

The CPU 20 decides whether or not the erase state is set (step S150). If all bits are in the all "1" erase state (step S150-Yes), then the process ends normally. If even one bit is not in the erase state (step S150-No), then the retry count is updated (step S152). If the retry count is below the allowable count (step S154-Yes) then the erase process is repeated. When the retry count exceeds the allowable count (step S154-No) then redundancy information is collected on the addresses that caused the erase error, a redundancy information write process performed (step S300), and a shift made to fail-safe mode.

Figure 16:
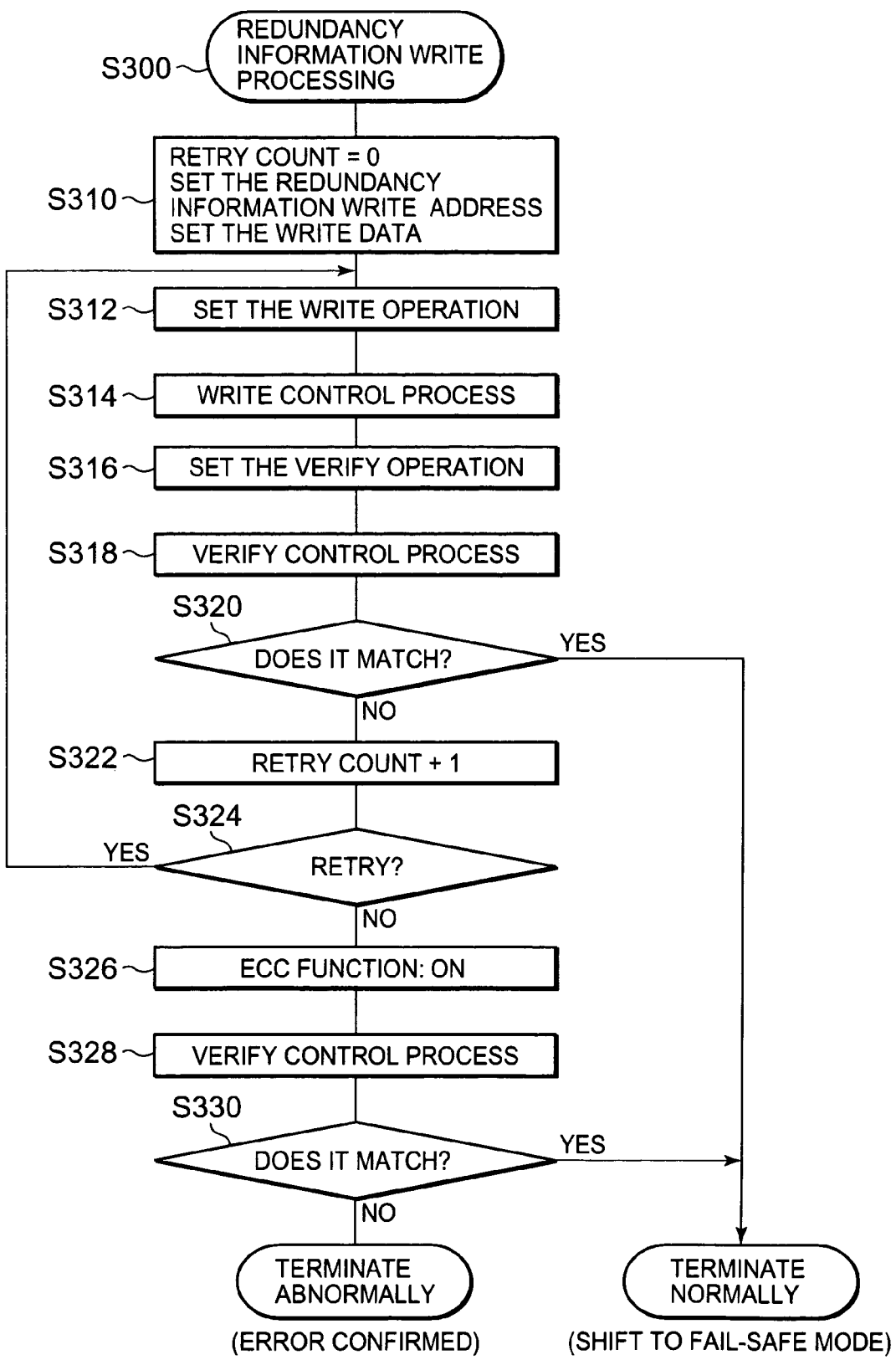
FIG. 16 is a flow diagram showing a redundancy information write process.

FIG. 16 is a flow chart showing the redundancy information write process 300. In the redundancy information write process 300, the redundancy information is written into the extra area 124. The CPU 20 resets the retry count (number of retries), sets the write start address in the address pointer 52, and sets the write data into the write buffer 54 (step S310).

The CPU 20 next sets control information showing the write operation into the control register 42 of rewrite control sequencer 40, and commands the rewrite control sequencer 40 to write data (step S312). The rewrite control sequencer 40 writes the data set into the write buffer 54, into the address set in the address pointer 52. The CPU 20 awaits the completion of data write (step S314). The ECC encoder at this time adds the ECC attachment information set in the write buffer 54, and outputs it to the memory cell array 120.

When data writing is complete, the CPU 20 sets the control information specifying the write verify process, into the control register 42 and commands the rewrite control sequencer 40 to perform write verify (step S316). The rewrite control sequencer 40 loads (or reads) the data, sets it into the read buffer 56, and compares it with the write data (step S318). The read (loaded) data is set into the read buffer 56 without any error correction. The rewrite control sequencer 40 at this time sets a threshold value for judging the logic level of the read signal output from the memory cell array 120 as verification value. This threshold value is a stricter value than the threshold value normal used for loading (reading) data.

The CPU 20 decides whether or not the write data matches the read data (step S320). This comparison is preferably made in the flash control unit 14 when the data includes ECC attachment information. The CPU 20 may also make the comparison. All bits are merely compared at this time without performing error correct with the ECC. If the data are a match (step S320-Yes), then the process for writing the redundancy information ends normally, and the operation shifts to fail-safe mode.

If results from the verification show a mismatch between the write data and the read data (step S320-No), then the retry count is updated (step S322), and if within the allowable count (step S324-Yes), then the process is repeated once again from step S312. When the retry count exceeds the allowable count (or number of allowable retries) (step S324-No), then the ECC function is enabled (step S326) to correct the write error in the memory cell of the applicable address. The ECC function restores the main section of the data (32 bits) from the read data (38 bits) based on the attachment information. One bit errors can be restored by this ECC function however two bit errors cannot be restored. If the errors relate to a bit line that is one bit, then this ECC function can correct that error. The write data can be verified again while this ECC function is in the enabled state (step S328).

Here, when the read data (32 bits) matches the write data (32 bits) (step S330-Yes), then the process terminates normally and operation shifts to fail-safe mode. If a mismatch, (step S330-No), then the error cannot be corrected even if the ECC function is enabled, so the process ends abnormally as a write error.

If the ECC function is always enabled during the write operation then memory cells with poor write characteristics might be restored by the ECC which is not desirable. The ECC function is therefore disabled, write retries made, and the ECC function enabled to correct errors when the retries exceed the allowable (retry) count. Error correcting is not performed when the allowable retry count was exceeded during write in normal mode.

The present invention has been described based on the above exemplary embodiments, but the present invention is not limited only to the above examples, and includes various kinds of alterations and modifications that could be achieved by a person skilled in the art within the scope of the invention of each of claims of this application as a matter of course.

Further, it is noted that Applicant's intent is to encompass equivalents of all claim elements, even if amended later during prosecution.

What is claimed is:

1. A semiconductor integrated circuit device, comprising:
a flash memory;
a processor which instructs a write operation, an erase operation, and an erase verify operation following the erase operation to the flash memory; and
a flash control unit which executes, in a normal mode, a writing to the flash memory based on a write command from the processor, and executes, in a fail-safe mode, the writing to the flash memory and correcting of an error of a written data based on the write command from the processor,
wherein the normal mode is shifted to the fail-safe mode when the erase verify operation in the normal mode indicates a defect,
wherein the flash control unit includes:
an error correction code (ECC) encoder which generates an error correction code for data written in the flash memory, write data being written into the flash memory along with the error correction code; and
an ECC decoder which corrects an error based on a read data read from the flash memory,
wherein, in the normal mode, when retries of a rewrite operation exceed a specified count, the flash memory is prohibited from being used, as a write detect, and wherein, in the fail-safe mode, when retries of the rewrite operation exceed the specified count, the ECC decoder is activated to perform the erase verify operation.

2. The semiconductor integrated circuit device according to claim 1, wherein the flash memory includes a substitute block, and
wherein, when a defect is detected in the erase verify operation after the erase operation, the flash control unit changes an access address in the flash memory to access the substitute block instead of a flash memory block that includes the defect.

3. The semiconductor integrated circuit device according to claim 2, wherein the flash memory includes:
an extra area which stores a redundancy information indicating a block in the flash memory where the defect is detected; and
an address register for changing the access address based on the redundancy information.

4. The semiconductor integrated circuit device according to claim 3, wherein the flash control unit includes:
a redundancy register which stores the redundancy information; and
a reset sequence control unit which reads out the redundancy information in the extra area and stores the redundancy information in the redundancy register, before an initialization of the processor.

5. The semiconductor integrated circuit device according to claim 1, wherein the flash memory includes multiple sections, and
wherein, when an area capable to write data in a first section among said multiple sections falls below a specified threshold, a valid data in the first section is copied into a second section, and then the valid data in the first section is erased.

6. The semiconductor integrated circuit device according to claim 5, wherein each of the multiple sections includes a header information, the header information including a plurality of flags.

7. The semiconductor integrated circuit device according to claim 1, wherein the processor instructs a write verify operation following the write operation, and
wherein the normal mode is not shifted to the fail-safe mode when the write verify operation in the normal mode indicates a defect.

8. A memory control method for a semiconductor integrated circuit device including a flash memory, a memory control unit, and a processor, said method comprising:
operating the flash memory in a normal mode;
operating the flash memory in a fail-safe mode; and
shifting the normal mode to the fail-safe mode, and
wherein the operating the flash memory in the normal mode includes:
performing a write operation to the flash memory;
performing an erase operation; and
performing an erase verify operation;
wherein the operating the flash memory in the fail-safe mode includes:
performing the write operation to the flash memory; and
correcting an error of a written data,
wherein the shifting the normal mode to the fail-safe mode is executed when the erase verify operation in the normal mode indicates a defect,
wherein the erase verify operation includes:
verifying the data written without performing an error correction based on an error correction code;

performing an error correction of data written based on the error correction code, as an error correction code (ECC) verify; and confirming an erasure state of an area erased by the erase operation, wherein the normal mode includes:

retrying to write the data, until a number of the erase verify operation reaches a specified number of times; and stopping using the flash memory as a write defect, when the retrying exceeds the specified number of times, and wherein the fail-safe mode includes:

retrying to write the data, until a number of the erase verify operation reaches a specified number of times; and retrying to write data written by using the ECC verify, when the retrying exceeds the specified number of times.

9. The memory control method according to claim 8, wherein the flash memory includes a substitute block, and wherein the memory control method further comprises:

converting an access address to access the substitute block instead of a defective block on the flash memory when the erase verify operation detects a defect after performing the erase operation.

10. The memory control method according to claim 9, wherein the flash memory comprises an extra area, and wherein the memory control method further comprises:

storing a redundancy information indicating a block of the flash memory where a defect was detected, onto the extra area; and converting the access address based on the redundancy information read out from the extra area.

11. The memory control method according to claim 10, further comprising:

reading the redundancy information stored in the extra area; and storing that redundancy information in a register before an initialization of a processor.

12. The memory control method according to claim 8, further comprising:

copying a valid data within a first section onto a second section, when an area for writing data within a first section in the flash memory falls below a specified threshold value; and erasing the data in the first section to set a blank state.

13. The memory control method according to claim 12, wherein each of the first and second sections comprises a header information, said header information including a plurality of flags, each of the flags being stored at a respective address corresponding to different word lines.

14. The memory control method according to claim 8, wherein the operating the flash memory in the normal mode further includes:

performing a write verify operation following the performing the write operation, and wherein the shifting the normal mode to the fail-safe mode is not executed when the write verify operation in the normal mode indicates a defect.

* * * * *